United States Patent
Kim et al.

(10) Patent No.: US 6,833,766 B2
(45) Date of Patent: Dec. 21, 2004

(54) ADAPTIVE LOOP GAIN CONTROL CIRCUIT FOR VOLTAGE CONTROLLED OSCILLATOR

(75) Inventors: Kwi-dong Kim, Daejeon (KR); Jong-kee Kwon, Daejeon (KR); Hee-bum Jung, Daejeon (KR); Kyung-soo Kim, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 10/410,829

(22) Filed: Apr. 9, 2003

(65) Prior Publication Data
US 2003/0197570 A1 Oct. 23, 2003

(30) Foreign Application Priority Data
Apr. 19, 2002 (KR) .................. 10-2002-0021644

(51) Int. Cl.[7] .............................................. H03L 7/00
(52) U.S. Cl. ........................................... 331/17; 331/74
(58) Field of Search ............................ 331/17, 74, 57, 331/176; 327/148, 157

(56) References Cited
U.S. PATENT DOCUMENTS

| 5,896,068 | A | 4/1999 | Moyal | |
|---|---|---|---|---|
| 5,963,101 | A | 10/1999 | Iravani | |
| 5,973,573 | A | 10/1999 | Iravani et al. | |
| 6,094,104 | A | * 7/2000 | Morgan | ........................ 331/57 |
| 6,229,403 | B1 | 5/2001 | Sekimoto | |
| 6,466,100 | B2 | * 10/2002 | Mullgrav et al. | ........... 331/179 |
| 2002/0041215 | A1 | * 4/2002 | Kiyose | ........................ 331/57 |

* cited by examiner

*Primary Examiner*—Robert Pascal
*Assistant Examiner*—Joseph Chang
(74) *Attorney, Agent, or Firm*—Blakely Sokoloff Taylor & Zafman

(57) ABSTRACT

There is provided an adaptive loop gain control circuit for a voltage-controlled oscillator (VCO). The adaptive loop gain control circuit for a voltage-controlled oscillator (VCO) includes a detected voltage generating unit which generates a detected voltage signal according to changes in an operating voltage and an operating temperature, and a control circuit unit which outputs an oscillation control current signal according to the detected voltage signal and an input control voltage signal. The adaptive loop gain control circuit for a voltage-controlled oscillator (VCO) compensates for an oscillation control current according to changes in operating voltage and temperature and compensates for the gain of a phase locked loop (PLL) system, thereby ensuring high operating stability in the PLL circuit.

5 Claims, 2 Drawing Sheets

STRENGTH OF OPERATING
VOLTAGE AND TEMPERATURE

ADAPTIVE LOOP GAIN CONTROL CIRCUIT FOR VOLTAGE CONTROLLED OSCILLATOR

BACKGROUND OF THE INVENTION

This application claims the priority of Korean Patent Application No. 2002-21644, filed on Apr. 19, 2002, in the Korean Intellectual Property Office, the disclosure of which is incorporated herein in its entirety by reference.

1. Field of the Invention

The present invention relates to an adaptive loop gain control circuit for a voltage-controlled oscillator (VCO), and more particularly, to an adaptive loop gain control circuit which compensates for a loop gain according to changes in an operating voltage and changes in temperature of a voltage-controlled oscillator (VCO) used in a phase locked loop (PLL) system.

2. Description of the Related Art

A phase locked loop (PLL) circuit synchronizes the phase of a received signal, where an oscillator or a periodic signal generator is controlled to operate at in-phase, synchronizes with respect to a reference signal. The PLL circuit has been used in various applications, including synchronous demodulation of a digital modulated wave, coherent carrier tracking, extension of a threshold, synchronization of a bit, and synchronization of a symbol.

FIG. 1 is a block diagram of a general phase locked loop (PLL) system.

Referring to FIG. 1, the PLL system includes a phase detector (PD) 110, a low pass filter (LPF) 120, and a voltage-controlled oscillator (VCO) 130 connected such that an output frequency signal of the voltage-controlled oscillator 130 is sent to the phase detector 110. The voltage-controlled oscillator 130 includes a voltage-to-current converter 131 and a ring oscillator 132. The voltage-to-current converter 131 converts an input control voltage $V_{CON}$ developed by an impedance of the low pass filter 120 into a control current $I_{CON}$ used to control an oscillation frequency corresponding to the input control voltage $V_{CON}$ and supplies the control current $I_{CON}$ to the ring oscillator 132. The ring oscillator 132 includes a plurality of current switches $S_1$ through $S_N$ that are connected in a ring-like arrangement where an input is connected to an output having an opposite polarity to that of the input to convert the control current $I_{CON}$ into the oscillation frequency. An oscillation frequency $f_{VCO}$ proportional to the control current $I_{CON}$ in the ring oscillator 132 having the plurality of current switches $S_1$ through $S_N$ is calculated as follows, $$f_{VCO} = \frac{N \cdot I_{CON}}{C \cdot V_O} \quad (1)$$

where C denotes a capacitive load of the current switches, and $V_O$ denotes the strength of the oscillation signal.

A frequency gain $K_{VCO}$ of the voltage-controlled oscillator 130, which converts an input control voltage signal into an output frequency signal, can be defined as follows.

$$K_{VCO} = \frac{\partial f_{VCO}}{\partial V_{CON}} \quad (2)$$

Therefore, the frequency gain $K_{VCO}$ of the voltage-controlled oscillator 130 with respect to the control current $I_{CON}$ can be expressed as follows.

$$K_{VCO} = \frac{\partial I_{CON}}{C \cdot V_O} \quad (3)$$

In addition, the gain A of the PLL system can be expressed as follows, $$A = \frac{K_\phi \cdot K_{VCO} \cdot Z(S)}{S} \quad (4)$$

where $K_\phi$ denotes a phase difference gain of the phase detector 110, Z(S) denotes an impedance of the low pass filter 120, and S denotes a frequency domain.

According to equation 4, the gain A of the PLL system is primarily proportional to the frequency gain $K_{VCO}$ of the voltage-controlled oscillator 130.

However, if there is a change in the operating environment such as a decrease in operating voltage or an increase in operating temperature, the frequency gain $K_{VCO}$ of the voltage-controlled oscillator 130 decreases. Therefore, the gain A of the PLL system decreases in proportion to the decrease in the frequency gain $K_{VCO}$ of the voltage-controlled oscillator 130. Thus, the input control voltage $V_{CON}$ has to be increased in order to maintain a predetermined oscillation frequency. The voltage-controlled oscillator 130 of the PLL system is sensitive to changes in the gain A of the PLL system under certain operating environments.

SUMMARY OF THE INVENTION

The present invention provides an adaptive loop gain control circuit for a voltage-controlled oscillator (VCO), which is capable of maximizing a linear region of an input control voltage and compensating for a gain of the PLL system in response to changes in the operating environment, in order to ensure wide operating stability of a phase locked loop (PLL) system.

According to an aspect of the present invention, there is provided a adaptive loop gain control circuit comprising a detected voltage generating unit which generates a detected voltage signal in response to changes in the operating voltage and operating temperature; and a control circuit unit which outputs an oscillation control current signal according to the detected voltage signal and an input control voltage signal.

It is preferable that the detected voltage generating unit comprises a filter which eliminates noise of the detected voltage signal. The filter is an RC filter comprising a resistor and a capacitor.

The detected voltage generating unit comprises a first MOS transistor which has a gate and a drain that are connected to a first supply voltage and a source that outputs the detected voltage; and a second MOS transistor which has a gate and a drain that are connected to a second supply voltage and a source that is connected the source of the first MOS transistor.

It is preferable that the control circuit unit comprises a first operational amplifier where the input control voltage signal is inputted to a non-inverting terminal and an inverting terminal is connected to an output terminal; a second operation amplifier where the detected voltage signal is input to a non-inverting terminal, an inverting terminal is connected to the output terminal of the first operation amplifier, the second operation amplifier amplifying a difference between output voltages of the detected voltage and the first operational amplifier and outputting the current control voltage signal; and a third MOS transistor which has a gate connected to the output terminal of the second operational amplifier and a source connected to the first supply voltage and outputs the control current signal to the first supply voltage. Here, it is preferable that the adaptive loop gain control circuit further comprises a filter comprising a capacitor and a resistor connected each other in parallel between the inverting terminal and the output terminal of the second operational amplifier.

BRIEF DESCRIPTION OF THE DRAWINGS

The above and other features and advantages of the present invention will become more apparent by describing in a detail exemplary embodiment thereof with reference to the attached drawings in which.

DETAILED DESCRIPTION OF THE INVENTION

The present invention now will be described more fully with reference to the accompanying drawings, in which a preferred embodiment of the invention are shown.

Figure 1:
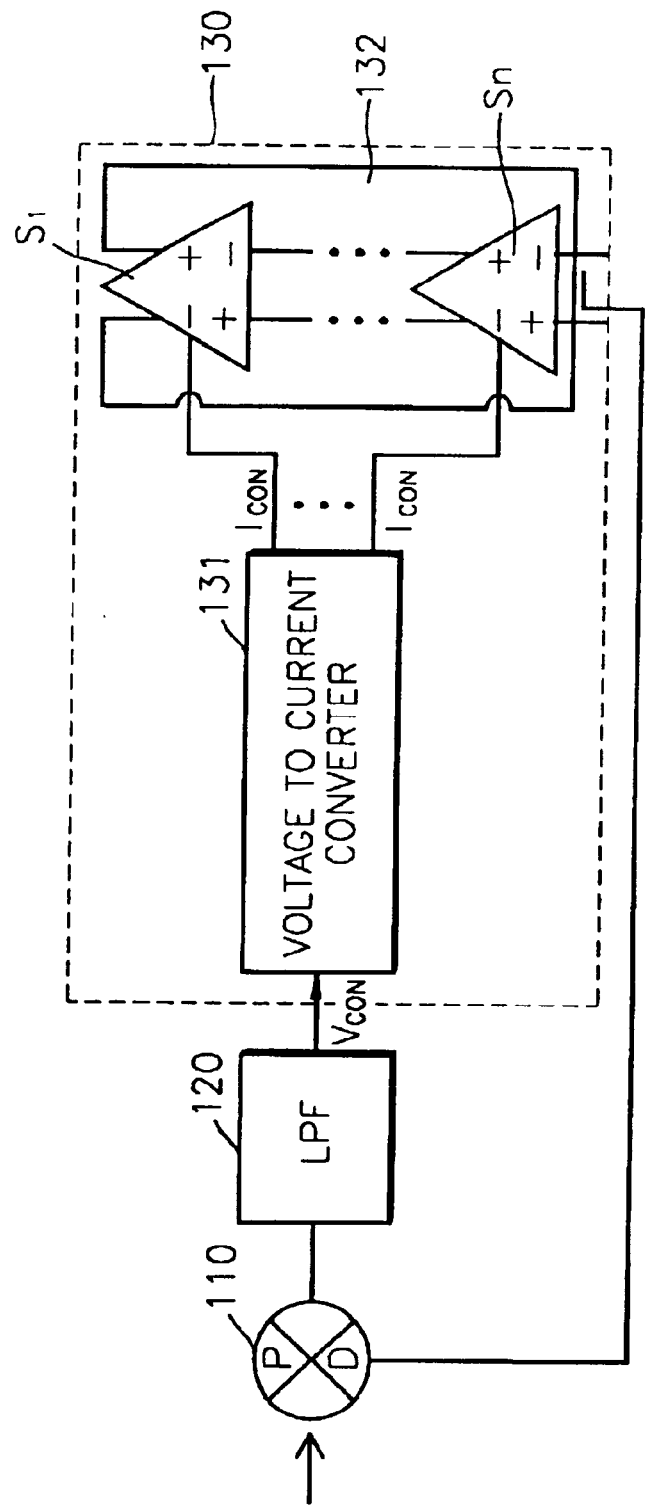
FIG. 1 is a block diagram of a general phase locked loop (PLL) system.
Figure 2:
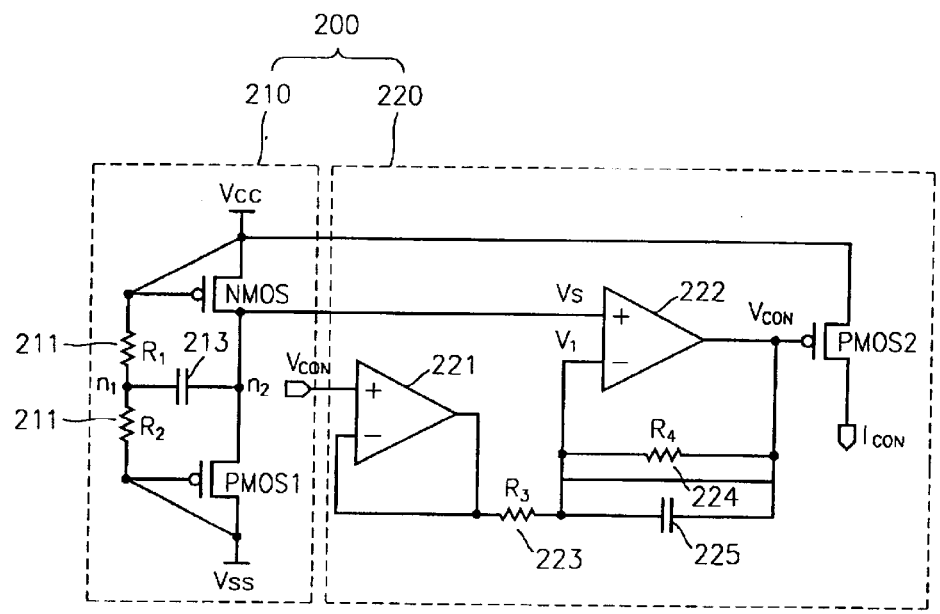
FIG. 2 is a circuit diagram of an adaptive loop gain control circuit according to the present invention.

FIG. 2 is a circuit diagram of an adaptive loop gain control circuit according to the present invention.

Referring to FIG. 2, an adaptive loop gain control circuit 200 according to the present invention includes a detected voltage generating unit 210 and a control circuit unit 220. The detected voltage generating unit 210 generates a detected voltage signal $V_S$ which has information on an operating voltage and an operating temperature. The control circuit unit 220 controls an oscillation frequency of a voltage-controlled oscillator in response to the detected voltage signal $V_S$ and an input control voltage signal.

The detected voltage generating unit 210 includes an n-channel MOS transistor NMOS, a first p-channel MOS transistor PMOS1, a first resistor 211, a second resistor 212, and a first capacitor 213. The gate of the n-channel MOS transistor NMOS is connected to a supply voltage $V_{CC}$, and the drain of the n-channel MOS transistor NMOS is also connected to the supply voltage $V_{CC}$. The source of the n-channel MOS transistor NMOS is connected to the source of the first p-channel MOS transistor PMOS1 and used as an input terminal of the control circuit unit 220. The gate and the drain of the first p-channel MOS transistor PMOS1 are connected to the supply voltage $V_{SS}$, and the source of the first p-channel MOS transistor PMOS1 is connected to the source of the n-channel MOS transistor NMOS. The first resistor 211 and the second resistor 212 are connected with each other in series. One end of the first resistor 211 is connected to the supply voltage $V_{SS}$, and one end of the second resistor 212 is connected to the supply voltage $V_{CC}$. The first capacitor 213 is disposed between a first node $n_1$ and a second node $n_2$. The first node $n_1$ is disposed between the first resistor 211 and the second resistor 212. The second node $n_2$ is disposed between the source of the n-channel MOS transistor NMOS and the source of the first p-channel MOS transistor PMOS1.

The control circuit unit 220 includes a first amplifier 221, a second amplifier 222, and a second p-channel MOS transistor PMOS2. The first amplifier 221 and the second amplifier 222 each include an operational amplifier. An input control signal $V_{CON}$ is input to the non-inverting terminal (+) of the first amplifier 221, and the output terminal of the first amplifier 221 is connected to the inverting terminal (−) of the first amplifier 221. The non-inverting terminal (+) of the second amplifier 222 is connected to the source of the n-channel MOS transistor NMOS and the source of the first p-channel MOS transistor (PMOS1) of the detected voltage generating unit 210. The detected voltage signal $V_S$ at the second node $n_2$ of the detected voltage generating unit 210 is input to the non-inverting terminal (+) of the second amplifier 222. The inverting terminal (−) of the second amplifier 222 passes through a third resistor 223 and is connected to the output terminal of the first amplifier 221. The inverting terminal (−) of the second amplifier 222 is connected to one side of a circuit in which a fourth resistor 224 and a second capacitor 225 are connected in parallel and the other side of the circuit is connected to the output terminal of the second amplifier 222. The output terminal of the second amplifier 222 is connected to the gate of a second p-channel MOS transistor PMOS2. The source of the second p-channel MOS transistor PMOS2 is connected to the supply voltage $V_{CC}$, and a drain of the second p-channel MOS transistor PMOS2 is connected to an output terminal of an oscillation control current $I_{CON}$.

The adaptive loop gain control circuit operates as follows.

Since the supply voltages $V_{CC}$ and $V_{SS}$ are connected to gates and sources of the n-channel MOS transistor NMOS and the first p-channel MOS transistor PMOS1, the n-channel MOS transistor NMOS and the first p-channel MOS transistor PMOS1 operate in a saturation region all the time. The strength of the detected voltage signal $V_S$ at the second node $n_2$ of the detected voltage generating unit 210 can be expressed as follows by using a relationship between currents of the n-channel MOS transistor NMOS and the first p-channel MOS transistor PMOS1, $$V_S = \frac{V_{SS} + V_{CC} \cdot \sqrt{\frac{K_N}{K_P}}}{1 + \sqrt{\frac{K_N}{K_P}}} \quad (5)$$

where $K_N$ denotes the operating temperature coefficient of the n-channel MOS transistor NMOS, $K_P$ denotes the operating temperature coefficient of the first p-channel MOS transistor PMOS1. In general, $K_P$ is greater than $K_N$.

As expressed in equation 5, the detected voltage signal $V_S$ is a function between the supply voltage $V_{CC}$ and $V_{SS}$ and the operating temperature. That is, the detected voltage signal $V_S$ decreases at a rate of $$1 + \sqrt{\frac{K_N}{K_P}}$$

in proportion to an increase in the operating temperature. The first capacitor 213, the first resistor 211, and the second resistor 212 are used as an RC filter which filters noise of the detected voltage signal $V_S$.

Figure 3:
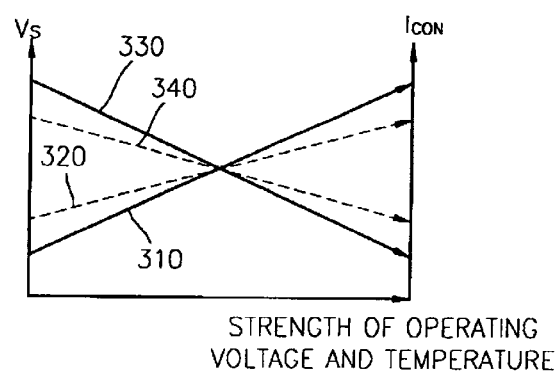
FIG. 3 is a graph showing changes in a detected voltage with respect to changes in the operating voltage and temperature of the adaptive loop gain control circuit of FIG. 2.

FIG. 3 is a graph showing changes in a detected voltage according to changes in the operating voltage and a temperature in the adaptive loop gain control circuit of FIG. 2. In FIG. 3, the axis of abscissa indicates the strength of the operating voltage and the operating temperature, the left axis of ordinates indicates a detected voltage $V_S$, and the right axis of ordinates indicates an oscillation control current $I_{CON}$.

Referring to FIG. 3, as the strength of operating voltages $V_{CC}$ and $V_{SS}$ increases, the detected voltage $V_S$ increases (310). As the detected voltage $V_S$ increases, a current control voltage $V_{COM}$ increases (320). In addition, as the operating temperature increases, the detected voltage $V_S$ is reduced (330). As the detected voltage $V_S$ decreases, the current control voltage $V_{COM}$ is reduced (340). The increase or decrease in the current control voltage $V_{COM}$ due to an increase in the supply voltages $V_{CC}$ and $V_{SS}$ and the operating temperature compensate for the oscillation control current $I_{CON}$ in response to changes in the strength of the operating voltage and the operating temperature. Thus, the gain of the PLL system with respect to changes in the operating voltage and temperature is compensated for by the input control voltage $V_{CON}$ corresponding to a predetermined frequency of an oscillator of the PLL circuit.

Referring to FIG. 2, when the gain of the first amplifier 221 of the detected voltage generating unit 210 is 1, the input control voltage $V_{CON}$ is output from the output terminal of the first amplifier 221 without changes in the strength of the input control voltage $V_{CON}$. The detected voltage signal $V_S$, which has information on changes in the operating voltage and the operating temperature, is inputted to the non-inverting terminal (+) of the second amplifier 222. A voltage signal $V_1$ is input to the inverting terminal (−) of the second amplifier 222, and the voltage signal $V_1$ can be expressed as follows, $$V_1 = R_3 \cdot \frac{V_{COM} - V_{CON}}{R_3 + R_4} \tag{6}$$

where $R_3$ denotes a resistance of the third resistor 223, and $R_4$ denotes a resistance of the fourth resistor 224. The difference of voltage $V_S$ and $V_1$ is amplified by the second amplifier 222 and the current control voltage $V_{COM}$ is output from the output terminal of the second amplifier 222. The current control voltage $V_{COM}$ can be expressed as follows.

$$V_{COM} \cong \left(\frac{R_4}{R_3} + 1\right) \cdot V_S - V_{CON} \cdot \frac{R_4}{R_3} \tag{7}$$

As shown in equation 7, a range of changes in the input control voltage $V_{CON}$ and the current control voltage $V_{COM}$ which makes it possible to control the oscillation control current $I_{CON}$ is from 0V to $$\left(\frac{R_4}{R_3} + 1\right) \cdot V_S,$$

and the input control voltage $V_{CON}$ and the current control voltage $V_{COM}$ can be changed by adjusting the resistance $R_3$ and $R_4$ of the third resistor 223 and the fourth resistor 224. The second capacitor 225, which is connected between the non-inverting terminal (−) and the output terminal of the second amplifier 222, eliminates noise of the output terminal of the second amplifier 222 and fortifies a gain of the second amplifier 222. The current control voltage $V_{COM}$ output from the second amplifier 222 is input to the gate of the second p-channel MOS transistor (PMOS2). If the second p-channel MOS transistor (PMOS2) operates in a saturation region, the oscillation control current $I_{CON}$ can be expressed as follows, $$I_{CON} = K_{P3} \cdot \left[V_{CC} - \left(\frac{R_4}{R_3} + 1\right) \cdot V_S + V_{CON} \cdot \frac{R_4}{R_3} - V_{TP2}\right]^2 \tag{8}$$

where $K_{P3}$ denotes a current coefficient of the second p-channel MOS transistor (PMOS2), and $V_{TP2}$ denotes a threshold voltage of the second p-channel MOS transistor (PMOS2).

As shown in equation 8 defining the oscillation control current $I_{CON}$ and equation 5 defining the detected voltage $V_S$, the gain of the PLL system, which is primarily proportional to the oscillation control current $I_{CON}$ output from the source of the second p-channel MOS transistor PMOS2 according to changes in the operating voltage and the operating temperature, is compensated for by changes in the detected voltage $V_S$.

As described above, the adaptive loop gain control circuit for the voltage-controlled oscillator according to the present invention compensates for the oscillation control current in response to changes in the operating voltage and the operating temperature, and the gain of the PLL system is compensated for according to compensation of the oscillation control current, thereby ensuring high operating stability in the PLL circuit.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An adaptive loop gain control circuit comprising:
    a detected voltage generating unit which generates a detected voltage signal in response to changes in the operating voltage and operating temperature; and
    a control circuit unit which outputs an oscillation control current signal according to the detected voltage signal and an input control voltage signal,
    wherein the detected voltage generating unit comprises a filter which eliminates noise of the detected voltage signal.

2. The adaptive loop gain control circuit of claim 1, wherein the filter is an RC filter comprising a resistor and a capacitor.

3. The adaptive loop gain control circuit of claim 1, wherein the detected voltage generating unit comprises:
    a first MOS transistor which has a gate and a drain that are connected to a first supply voltage and a source that outputs the detected voltage; and
    a second MOS transistor which has a gate and a drain that are connected to a second supply voltage and a source that is connected the source of the first MOS transistor.

4. The adaptive loop gain control circuit of claim 1, wherein the control circuit unit comprises:
    a first operational amplifier where the input control voltage signal is inputted to a non-inverting terminal and an inverting terminal is connected to an output terminal;
    a second operational amplifier where the detected voltage signal is inputted to a non-inverting terminal, an inverting terminal is connected to the output terminal of the first operational amplifier, the second operational amplifier amplifying a difference between output voltages of the detected voltage and the first operational amplifier and outputting the current control voltage signal; and
    a third MOS transistor which has a gate connected to the output terminal of the second operational amplifier and a source connected to the first supply voltage and outputs the control current signal to the first supply voltage.

5. The adaptive loop gain control circuit of claim 4, wherein the adaptive loop gain control circuit further comprises a filter comprising a capacitor and a resistor connected with each other in parallel between the inverting terminal and the output terminal of the second operational amplifier.

* * * * *